United States Patent
Roza

(10) Patent No.: US 6,215,434 B1
(45) Date of Patent: Apr. 10, 2001

(54) METHOD FOR CONVERTING AN ANALOG INPUT SIGNAL INTO A DIGITAL OUTPUT SIGNAL AN ARRANGEMENT FOR PERFORMING SUCH METHOD AND AN IMAGE COMPRISING SUCH ARRANGEMENTS

(75) Inventor: Engel Roza, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/129,808

(22) Filed: Aug. 6, 1998

(30) Foreign Application Priority Data

Aug. 7, 1997 (EP) .................................................. 97202447

(51) Int. Cl.$^7$ ................................................. H03M 1/60
(52) U.S. Cl. ............................................. 341/157; 341/166
(58) Field of Search ....................................... 341/157, 166

(56) References Cited

U.S. PATENT DOCUMENTS

| 4,584,566 | * | 4/1986 | Arcara | 340/347 |
|---|---|---|---|---|
| 4,675,649 | * | 6/1987 | Forehand et al. | 340/347 |
| 5,502,440 | * | 3/1996 | New | 341/157 |
| 5,548,286 | * | 8/1996 | Craven | 341/126 |
| 5,874,909 | * | 2/1999 | Soenen et al. | 341/141 |

OTHER PUBLICATIONS

PHN 16,308, U.S. Ser. No. 09/060,086, Filed: Apr. 14, 1998.

* cited by examiner

Primary Examiner—Brian Young
Assistant Examiner—Jason L W Kost
(74) Attorney, Agent, or Firm—Steven R. Biren

(57) ABSTRACT

A method and arrangement for converting an analog input signal into a digital output signal. The analog input signal is converted into a duty cycle modulated square wave. For reducing the communication rate of the digital output signal a time frame of subsampling periods is created and, within each subsampling period, the position of samples, which approximately coincide with the transients of the square wave, is determined. The invention further provides an image sensor comprising a plurality of such arrangements.

7 Claims, 2 Drawing Sheets

METHOD FOR CONVERTING AN ANALOG INPUT SIGNAL INTO A DIGITAL OUTPUT SIGNAL AN ARRANGEMENT FOR PERFORMING SUCH METHOD AND AN IMAGE COMPRISING SUCH ARRANGEMENTS

BACKGROUND OF THE INVENTION

This invention relates to a method of converting an analog input signal into a digital output signal comprising the steps of deriving a square wave duty cycle modulated by the analog input signal, of generating a clock synchronous sampling pulse and of sampling the duty cycle modulated square wave with the clock synchronous sampling pulse to generate the digital output signal.

An arrangement for carrying out such method has been proposed in applicant's earlier european patent application (PHN 16308). This patent application discloses an asynchronous sigma delta modulator as a preferred means for deriving the square wave, which is duty cycle modulated by the analog input signal. The asynchronous sigma delta modulator mainly comprises an integrating filter and a comparator in feedback arrangement, and is relatively easy to build and robust in operation. The square wave, generated by the asynchronous sigma delta modulator, contains the information in the analog time-positions of its transients. In order to convert the signal into a digital format, the square wave is subsequently sampled by a clock synchronous sampling pulse. The sampling of the square wave results in a digital signal which may be referred to as a one-bit-coded bitstream. It is further disclosed in the above mentioned european patent application that the bitstream may be converted in any suitable PCM-format by means of a decimating digital filter.

The process of sampling the duty cycle modulated square wave implies the introduction of sampling noise whose level is lower the higher the sampling rate is. In practice, when usual moving picture video signals have to be converted, a sufficiently low sampling noise is obtained when the sampling rate, and consequently the communication rate between the sampler and the decimating digital filter, is higher then several Gbits/s. Such a high communication rate may pose a serious problem, for instance when the sampler and the decimating filter have to be implemented on different integrated circuits. However, also when sampler and decimating digital filter are implemented on a single integrated circuit, the transport of the bits between the two functional blocks at this high rate may be impractical. The above mentioned european patent application discloses the use of a polyphase sampler using a plurality of samplers, thereby reducing the sampling rate of each individual sampler. However, this measure does not reduce the total communication rate of the bits originating from the entirety of samplers.

SUMMARY OF THE INVENTION

It is the object of the present invention to provide a method of converting an analog input signal into a digital output signal whereby the total communication rate of the digital output signal is substantially reduced with respect to the previously proposed arrangements and the method according to the present invention is characterized in that a clock synchronous subsampling signal, having a predetermined subsampling period, is derived and that said step of sampling the duty cycle modulated square wave includes the step of detecting, within each subsampling period, the position of sampling pulses which approximately coincide with the transients of the duty cycle modulated square wave. Therefore, rather than passing the high rate serial bitstream for further processing, the addresses of the transients of the square wave within a frame of subsampling periods, are passed.

It may be noted that it is known per se to apply so called run-length coding methods, which determine in a bitstream the length of the portions of bits of one value, and which output codes representing these lengths rather than the bitstream itself, thereby also substantially reducing the communication rate of the digital signal. However, these methods have the disadvantage that the codes, representing the run-lengths, are generated at irregular intervals, which make their subsequent decoding more difficult. More particularly, a considerable amount of signal processing with a substantial amount of hardware is required for this approach. In contradistinction therewith, the method of the present invention generates subsampling periods and in each subsampling period the approximate positions of the transients of the duty cycle modulated square wave. In this way an "address coding" of the positions of the transients within each subsampling period is achieved. However, other schemes are possible, e.g. first counting and storing the number of sampling pulses from the start of the subsampling period until the first transient of the duty cycle modulated square wave and then counting and storing the number of sampling pulses from the first transient to the second transient (if any) and eventually from the second transient to the third one and so on. This gives in effect a combination of "address coding" and "run length coding" but without the above mentioned drawback of known "run length coding".

In the method of the invention, each subsampling period maximally comprises a predetermined number of square wave transients. This number depends on the frequency (the rate) of the subsampling pulses relative to the frequency of the square wave. When said number is larger, more hardware is required for carrying out the method. On the other hand, when the number is smaller, the reduction of the total communication rate is less. It has been found a good compromise when, according to a further characteristic of the invention the length of the subsampling period is selected so that each subsampling period includes no more than two transients of the duty cycle modulated square wave. Then the position of the first transient may e.g. be stored in a first register and the position of the second transient in a second register. However, it is alternatively possible to store e.g. each leading transient of the square wave in the first register and each trailing transient in the second register, or vice versa.

It may further be noted that the sampling of the square wave may either be direct or indirect. In case of direct sampling the square wave is sampled by a high rate sampling pulse thereby creating a high rate bitstream and subsequently, within each subsampling period, the positions of those bits of the bitstream, which approximately coincide with the transients of the square wave, are detected and stored. In case of indirect sampling no high rate bitstream is created and therefore the hardware required for carrying out the method of the present invention is simpler and more robust. The method with indirect sampling is characterized by counting sampling pulses during each subsampling period and by detecting and storing the value of the count resulting from said counting upon each occurrence of a transient of the duty cycle modulated square wave.

The method of the present invention may not only be used to reduce the total communication rate of the digital signal, but additionally and simultaneously to multiplex a plurality of digital signals originating from a plurality of analog input signals. Therefore the method according to the present invention may be further characterized by simultaneously converting a plurality of analog input signals into a corresponding plurality of digital output signals each thereof comprising information on the position, within each subsampling period, of sampling pulses which approximately coincide with the transients of the duty cycle modulated square wave obtained from the corresponding analog input signal, and by subsequently multiplexing the plurality of digital output signals into a digital multiplex signal for further processing. Preferably the counting of the sampling pulses for the conversion of said plurality of analog input signals is achieved by means of a common counter.

The invention also relates to an arrangement for converting an analog input signal into a digital output signal which is characterized by a duty cycle modulator for deriving a square wave duty cycle modulated by the analog input signal, a clock synchronous sampling pulse generator, a clock synchronous subsampling pulse generator and means for detecting, within each period of the subsampling pulse, the position of the sampling pulses which approximately coincide with the transients of the duty cycle modulated square wave.

The invention further relates to an image sensor comprising a plurality of rows of active picture elements, which is characterized in that the image sensor further comprises a plurality of arrangements as above described, each of said arrangements being connected to a row of active picture elements for converting the analog video input signal, resulting from scanning the row of active picture elements, into a digital video output signal, and means for multiplexing the plurality of digital video output signals delivered by said plurality of arrangements.

BRIEF DESCRIPTION OF THE DRAWING

The invention will be further clarified with reference to the attached figures. Herein shows.

DESCRIPTION OF THE PREFERRED EMBODIMENTS

Figure 1:
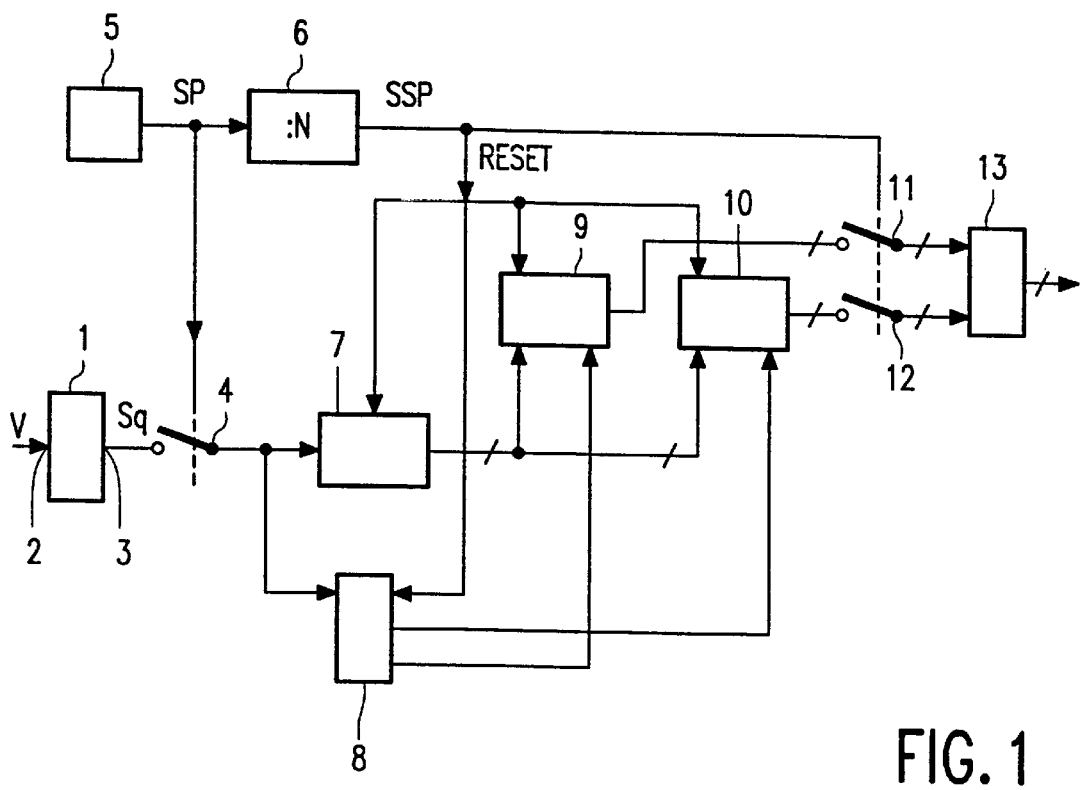
FIG. 1 a first arrangement for carrying out the method of the invention.

The arrangement of FIG. 1 comprises an asynchronous sigma delta modulator 1, having an input terminal 2 to which an analog input signal v is applied and an output terminal 3 from which a duty cycle modulated square wave sq is obtained. With a sampler 4 the square wave sq is sampled by sampling pulses sp which are obtained from a clock generator 5. The duty cycle $\tau/T$ of the square wave is approximately linearly dependent on the value of the input signal v and may be represented by the formula:

$$\frac{\tau}{T} \approx \frac{1+v}{2} \qquad (1)$$

wherein $\tau$ is the time the square wave has one value (e.g. "high") and T is the period of a complete cycle of the square wave. The frequency f (=1/T) of the square wave is nonlinearly dependent on the input signal v according to the formula:

$$f/f_c = \omega/\omega_c \approx 1 - v^2 \qquad (2)$$

Herein $f_c$ is the centre frequency, i.e. the frequency of the square wave when the input signal v=0, and $\omega$ and $\omega_c$ are the angular frequencies of f and $f_c$ respectively. The centre frequency $f_c$ is dependent on the dimensioning of the asynchronous sigma delta modulator and may, in case of standard video input signals, be selected at 32 Mhz. In order to sufficiently reduce the sampling noise, the sampling rate of the pulses sp should then be preferably 4 GHz or higher. The output of the sampler 4 is a bitstream comprising bits of e.g. the value +1 when at the sampling instants the square wave of the duty cycle modulator is "high" and of the value −1 when at the sampling instants the square wave of the modulator is "low". More particulars of the asynchronous sigma delta modulator 1 and the sampler 4 are disclosed in applicants above mentioned prior patent application.

The pulse from clock generator 5, apart from being used as sampling pulse for the sampler 4, is also applied to a divider 6 for deriving a clock controlled subsampling pulse ssp. If the divider has a division ratio N, the subsampling period of the pulses ssp comprise N sampling periods of the sampling pulses sp. The subsampling pulses ssp periodically reset a counter 7. This counter receives the bitstream originating from the sampler 4 and counts the bits of this bitstream. Furthermore the bitstream is applied to a polarity change detector 8 whose outputs enable registers 9 and 10 to store the value of the counter 7 at the instants at which the polarity of the bits of the bitstream changes, i.e. approximately at the instants at which the transients of the square wave appear. More particularly: after the counter has been reset by a subsampling pulse ssp, the counter counts e.g. the +1 bits of the bitstream. When the detector detects a −1 bit in the bitstream (as the result of a trailing transient in the square wave sq) the content of the counter is stored in register 9. Now the counter continues the count of the −1 bits and when the detector detects a +1 bit in the bitstream (as the result of a leading transient in the square wave), the content of the counter is stored in register 10. Consequently, the register 9 now contains the address of the first bit-polarity change of the bitstream and register 10 contains the address of the second bit-polarity change of the bitstream. If more polarity changes of the bits of the bitstream may appear during a subsampling period, correspondingly more registers have to be added. However, as it will be explained afterwards, the arrangement is preferably dimensioned so that no more than 2 polarity changes can occur within one subsampling period.

When the next subsampling pulse ssp arrives, the contents of the registers 9 and 10 are read out through switches 11 and 12 respectively. Subsequently, the counter 7, the two registers 9 and 10 and the polarity change detector 8 are reset by the subsampling pulse ssp.

The reading out of the registers 9 and 10 may be either simultaneously or sequentially, thereby constituting the digital output signal which is a digital representation of the analog input signal v. This digital output signal may be fed into a suitable transport channel and/or applied to a suitable utilization device 13. Because the addresses of the digital output signal unambiguously represent the value of the input signal, the addresses may be converted to any other digital format which unambiguously represent the input signal. In this connection it may be observed that such conversion may e.g. calculate from the first and the second of three successive addresses the approximate length (in terms of an integer number of sampling periods) of the "on" time τ of the square wave sq, and from the first and the third of these addresses the approximate length (also in terms of an integer number of sampling periods) of the period T of the square wave sq. By dividing the two obtained "lengths" the approximate duty cycle τ/T and, with formula (1), the approximate value v e.g. in PCM-format may be obtained. The conversion may for instance be implemented with a look up table which is programmed in accordance with the above given algorithm.

Figure 2:
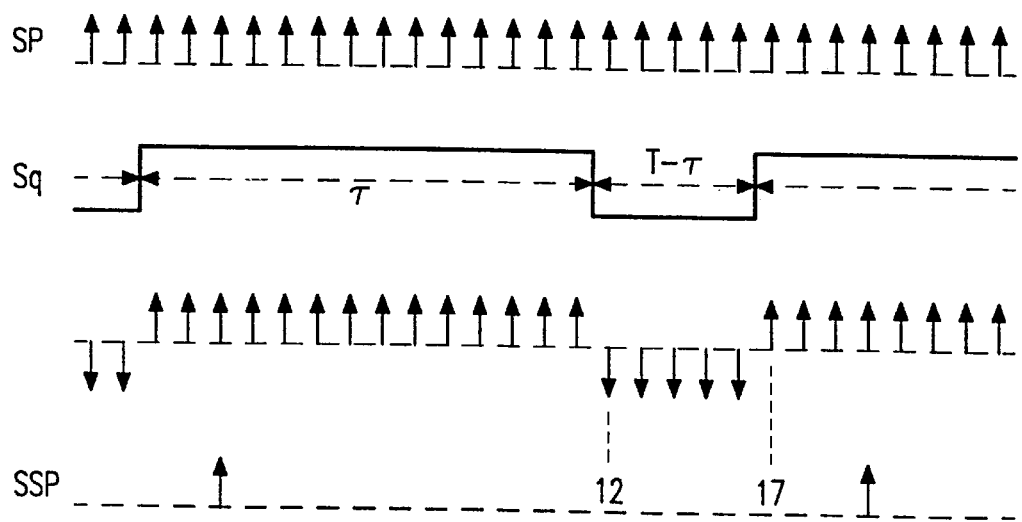
FIG. 2 waveforms clarifying the operation of the arrangement of FIG. 1.

FIG. 2 shows a time domain representation of the process described above. The upper line shows the sampling pulses sp obtained from the clock generator 5. The second line shows the square wave sq delivered by the asynchronous sigma delta modulator 1. The third line shows the sequence of samples which is output by the sampler 4. The last line shows the subsampling pulses and the addresses, i.e. the counts, which are stored in the registers 9 and 10. In FIG. 2 these counts have the values 12 and 17. It may be remarked that for the sake of clarity one sampling period in FIG. 2 covers 20 sampling periods (N=20). However in practice a subsampling period may comprise much more sampling periods, e.g. over 400. Then the addresses stored in registers 9 and 10 may be correspondingly higher and have to be stored in the registers 9 and 10 and output to the utilization device 13 by means of e.g. 9-bits words.

From formula (2) it follows that the centre frequency $f_c$ is the highest frequency of the square wave sq. This means that if a subsampling period has to contain no more than two transients of the square wave under all conditions of the input signal v, the subsampling period has to be chosen just smaller than the period of the centre frequency. With other words: the subsampling frequency should be chosen just above the centre frequency of the asynchronous sigma delta modulator 1. This choice of the subsampling frequency would mean a transmission of maximally two addresses per subsampling period, i.e. two registers for storing the addresses are necessary. If the subsampling frequency would be sufficiently increased, storage and transmission of a single address per subsampling period would be possible requiring only a single register. It can be calculated from formulas (1) and (2) that this situation would occur when the subsampling frequency would be at least equal to four times the centre frequency $f_c$ of the asynchronous sigma delta modulator. Such transmission with one address per subsampling period is however less efficient then transmission with two addresses per subsampling period.

Several modifications may be made in the arrangement of FIG. 1, without departing from the scope of the present invention. For instance, in stead of counting the +1 and −1 bits of the bitstream, the counter may be driven directly by the sampling pulses sp from the clock generator. The polarity change detector 8 should of course receive the bitstream from the sampler 4. Also, the counter may be reset by both the subsampling pulses ssp and the output pulses of the detector 8 just after the counts are stored in the registers. Then register 9 stores the position of the first polarity change with respect to the start of the subsampling period,as it did before. However, the register 10 now stores the position of the second polarity change with respect to that of the first polarity change, which is in fact the run length of the bits between the first and the second polarity change.

As mentioned above, the registers 9 and 10, after being read out under the control of the subsampling pulse ssp, are reset to e.g. the value 0. If the registers would not be reset and the next subsampling period would contain less than two square wave transients, any register which is not used during this next subsampling period would pass a transient position of the preceding subsampling period to the utilization device 13. By resetting the registers, the reset value would in stead be passed to the utilization device, which can then interpret this value as a "no transient" situation.

Figure 3:
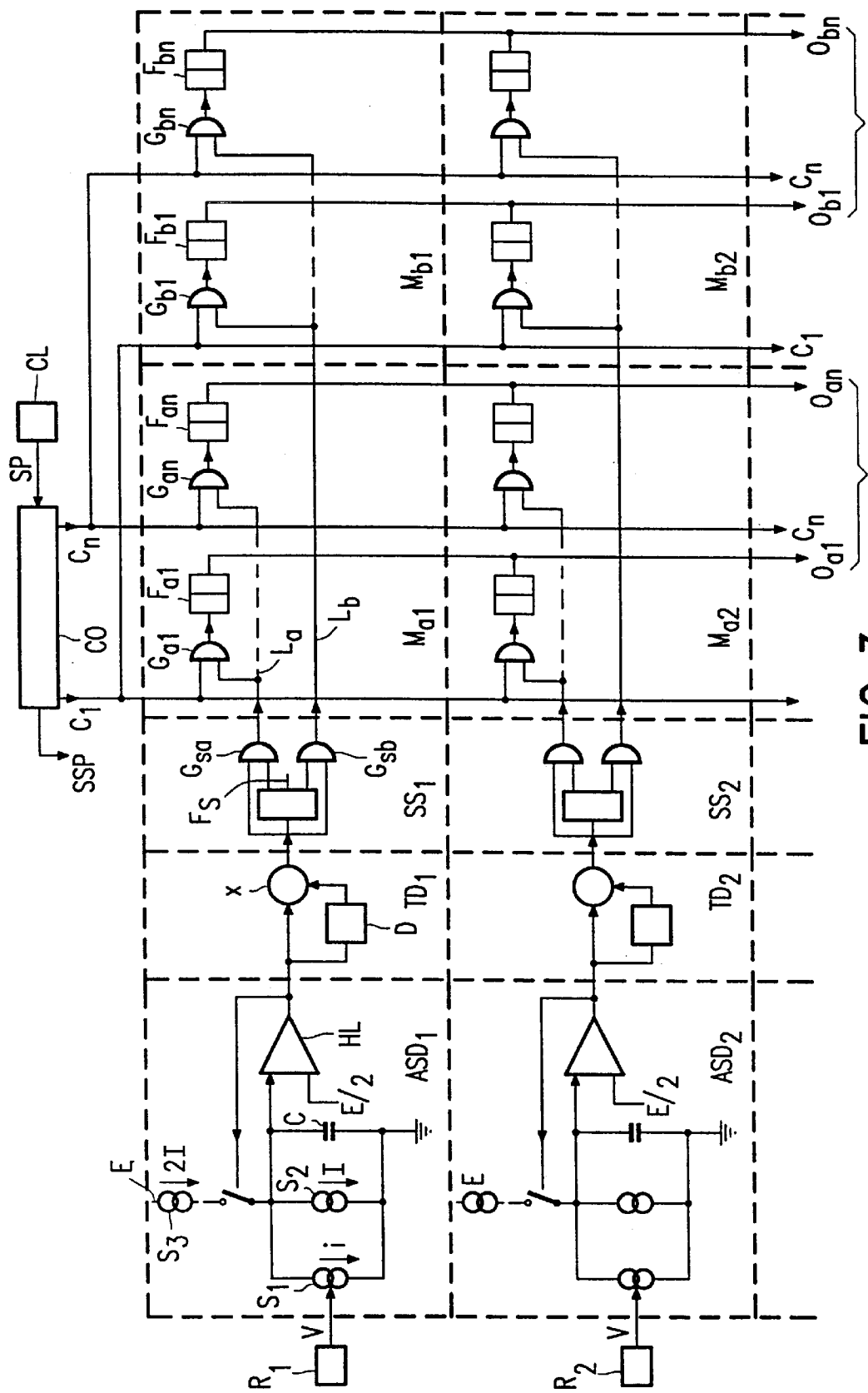
FIG. 3 an image sensor arrangement for carrying out the method of the invention.

Apart from reducing the communication rate, the method of the present invention can also, and additionally, be used if the signal processing chain has to be broken up for some reason of partitioning. e.g. for multiplexing signals from a plurality of sources. This will be illustrated with FIG. 3, which shows a signal processing part of a CMOS image sensor. Such image sensor comprises a two dimensional array of active pixel elements which pixel elements are arranged in rows. In FIG. 3 these rows are schematically represented by the blocks $R_1$, $R_2$. The pixel elements are matrix addressable by bit lines and word lines. The addressing mode is supposed to be a consecutive scan of the pixel elements within a row, whereas the rows of the matrix are simultaneously scanned.

For easy understanding a dimensioning of the arrangement of FIG. 3 will be given by way of example. Suppose that the image sensor has a configuration of 400*400 pixels and that the sensor is read out in 20 ms. This results for each row in an analog video signal v with a bandwidth B of about 10 Khz. The video signal generated by the first row $R_1$ is applied to a cascade of an asynchronous sigma delta modulator $ASD_1$, a transient detector $TD_1$, a status switch $SS_1$ and two memories $Ma_1/Mb_1$. The video signal generated by the second row of pixel elements $R_2$ will be processed in a similar cascade $ASD_2$, $TD_2$, $SS_2$, $Ma_2/Mb_2$, and so on. The corresponding blocks of all cascades are identical. The blocks of the first cascade and their operation will now be explained further.

The asynchronous sigma delta modulator $ASD_1$ comprises a current source $S_1$, which converts the analog input signal voltage v into a signal current i, a current source $S_2$ sinking a constant current I and a switched current source $S_3$ sourcing a switched current 2*I. The three currents are together applied to an integrating capacitor C and the voltage across this capacitor is applied to a hard limiter HL, which compares the capacitor voltage with a constant voltage level E/2 to generate a square wave, which is fed back to switch the current source $S_3$. In fact the current sources $S_2$ and $S_3$ convert the square wave voltage at the output of the hard limiter HL into a square wave current-replica that switches between +I and −I. The input current i of current source $S_1$ is added to this square wave current. Of course, in practice, the two current sources $S_1$ and $S_2$ are constituted by one voltage controlled current source drawing the current I+i which may vary between 0 and 2*I.

In order to avoid undue aliasing distortion by the asynchronous sigma delta modulator, the centre frequency $f_c$ of the square wave, i.e. the frequency of the square wave when v=0, should be at least approximately three times the bandwidth B of the input signal. Therefore, in the above given example, the centre frequency $f_c$ is made equal to 30 Khz. For the asynchronous sigma delta modulator shown in FIG. 3, it can be found for the centre frequency $f_c$:

$$f_c \approx \frac{I}{2 \cdot C \cdot h} \tag{3}$$

wherein C is the capacitance of the capacitor C and h is the hysteresis of the hard limiter HL. Of course, for the image sensor of FIG. 3, it is of importance that the elements of the cascade $ASD_1$, $TD_1$, $SS_1$, $Ma_1/Mb_1$ fit within the pitch of the rows of pixels. With other words, this cascade should occupy only a small part of the chip area. This especially holds for the capacitor C. Practical values for I, C and h, which may suitably be realized in CMOS-technology, are: I=6 nA, C=200 fF, and h=0.5 V. From formula (3) it follows that these values give the desired centre frequency $f_c$ of 30 kHz.

The square wave from the asynchronous sigma delta modulator is applied to the transient detector $TD_1$. This transient detector contains an exor-gate X and a delay D. The exor gate receives the undelayed square wave and the square wave delayed by the delay D. The result of the exor operation is a short transient pulse of duration D at each transient of the square wave.

The transient pulse from the transient detector $TD_1$ is applied to a status switch $SS_1$, which serves to discriminate between the first and second transient pulse within a subsampling period. This status switch comprises a status flip-flop Fs and two status AND-gates Gsa and Gsb, each with a status output line La and Lb respectively. The transient pulses from the transient detector $TD_1$ are fed to both AND-gates Gsa and Gsb and to the flip-flop Fs and the two complementary outputs of the flip-flop Fs are fed to the other inputs of the AND-gates Gsa and Gsb. When the flip-flop is reset at the start of a subsampling period (not shown), it opens gate Gsa and closes gate Gsb. When the first transient pulse is received this pulse is transferred through the open gate Gsa to the output line La of this gate. At the trailing edge of the first transient pulse the flip-flop Fs changes state, so that gate Gsa is closed and gate Gsb is opened. When, thereafter, a second transient pulse is received from the transient detector $TD_1$, this pulse is passed through gate Gsb to its output line Lb. Consequently, output line La conveys all first transient pulses (if any) and output line Lb conveys all second transient pulses (if any) of the subsampling periods.

The arrangement of FIG. 3 further comprises a clock controlled sampling pulse generator CL which supplies a sampling pulse sp to a counter CO. The counter counts the sampling pulses and delivers the result of the counting in the form of an n-bits word to its output bus $C_1 \ldots C_n$. The counter counts N sampling pulses and then starts a new counting cycle. One counting cycle constitutes one subsampling period. When the counter starts a new cycle, a subsampling pulse ssp is generated which is used for purposes to be described afterwards.

The memory $Ma_1$ comprises n AND-gates $Ga_1 \ldots Ga_n$ and n dual flip-flops $Fa_1 \ldots Fa_n$, each of the latter having a first and a second flip-flop. These are arranged so that each first flip-flop receives and stores the bit supplied through the AND-gate and each second flip-flop receives and stores the bit supplied by the first flip-flop. The outputs of the second flip-flops of $Fa_1 \ldots Fa_n$ are interconnected with the outputs of the corresponding second flip-flops of the other rows through output buslines $Oa_1 \ldots Oa_n$. The construction of memory $Mb_1$, comprising AND-gates $Gb_1 \ldots Gb_n$ and dual flip-flops $Fb_1 \ldots Fb_n$ is similar to that of the memory $Ma_1$ and the outputs of the second flip-flops of $Fb_1 \ldots Fb_n$ are interconnected with the outputs of the corresponding flip-flops of the other rows through output buslines $Ob_1 \ldots Ob_n$.

In operation, when during a subsampling period a transient pulse is supplied through output line La to the AND-gates $Ga_1 \ldots Ga_n$, these gates open and store the prevailing value of the count in the first flip-flops of $Fa_1 \ldots Fa_n$. When during the same subsampling period a second transient of the square wave occurs, a transient pulse is applied through output line Lb to AND-gates $Gb_1 \ldots Gb_n$. Then these gates open and the then prevailing value of the count is stored in the first flip-flops of $Fb_1 \ldots Fb_n$. When subsequently the count reaches its final value (N), the subsampling period ends and the counter supplies a new subsampling pulse ssp. This pulse is supplied to all dual flip-flops (not shown) and transfers the contents of each first flip-flop of $Fa_1 \ldots Fa_n$ and $Fb_1 \ldots Fb_n$ into the corresponding second flip-flop. Thereafter the pulse ssp resets the Fs flip-flop and all the mentioned first flip-flops. During the next subsampling period all second flip-flops are sequentially read out in a manner not shown in FIG. 3 but well known in the art, so that a multiplexed digital signal results at the output busses $Oa_1 \ldots Oa_n$ and $Ob_1 \ldots Ob_n$.

Returning again to the dimensioning example of the arrangement of FIG. 3, it can be shown that for the signal/sampling noise ratio $P_s/P_n$ the following formula holds:

$$\frac{P_s}{P_n} \approx \frac{3}{16} \cdot \frac{f_s^2}{B \cdot f_c} \tag{4}$$

wherein $f_s$ is the sampling frequency. From this formula (4) it follows that for a sufficiently high signal to sampling noise ratio of about 50 db, and with B=10 kHz and $f_c$=30 kHz as given above, the sampling frequency $f_s$ should be selected as high as 13 MHz. From this value of the sampling frequency it further follows that N, which is the ratio between the sampling frequency and the subsampling frequency, is equal to 13 MHz/30 kHz=433. Therefore, in one subsampling period, the counter CO counts up till 433 sampling pulses sp. This means that the two address busses should be each 9 bits wide (n=9).

In the arrangement of FIG. 3 each row of the image sensor generates $f_{ss}$*2 9-bit words per second, i.e. 60K words/s or 540 Kbit/s. Then the total communication rate for all 400 rows is 24M words/s=216 Mbit/s. In contradistinction, the total communication rate without bit compression would be 400*13 MHz=5,2 Gbit/s.

It may be observed that the counter CO of FIG. 3 is in common for all the 400 rows of the image sensor and that it also functions as the :N divider 6 of FIG. 1 for generating the subsampling pulse ssp. It is further noted that the arrangement of FIG. 3 uses the indirect sampling method referred to in the introductory part of this application.

The memory blocks $Ma_1/Mb_1$, $Ma_2/Mb_2$. . . together constitute a RAM-memory of 400*18 dual cells (flip-flops). It is also possible to use e.g. two RAM-memories of 400*18 single memory cells each. Then, during one subsampling period one RAM-memory is loaded and during the next subsampling period this RAM-memory is read out and the other RAM-memory is loaded, and so on.

In stead of using a transient detector $TD_1$ and status switch $SS_1$, as shown in FIG. 3, which discriminate between first and second transients, it is also possible to use an arrangement which discriminates between leading and trailing transients of the square wave. The utilization device, which receives the output words applied through the output busses $Oa_1 \ldots Oa_n$ and $Ob_1 \ldots Ob_n$, has then to be accordingly designed.

It may be appreciated that, if the rows of pixel elements $R_1, R_2 \ldots$ of the image sensor are oriented horizontally, a vertically scanned digital output signal results. Therefore, if a horizontally scanned digital output signal is desired, the rows $R_1, R_2 \ldots$ have to be oriented vertically.

What is claimed is:

1. A method of converting an analog input signal into a digital output signal comprising the steps of deriving a square wave duty cycle modulated by the analog input signal, generating a clock synchronous sampling pulse, and sampling the duty cycle modulated square wave with the clock synchronous sampling pulse to generate the digital output signal, characterized in that a clock synchronous subsampling signal (ssp), having a predetermined subsampling period, is derived from said clock synchronous sampling pulse and that said step of sampling the duty cycle modulated square wave (sq) includes the step of detecting, within each subsampling period, the position of sampling pulses (sp) which approximately coincide with the transients of the duty cycle modulated square wave.

2. A method as claimed in claim 1 characterized by simultaneously converting a plurality of analog input signals into a corresponding plurality of digital output signals each thereof comprising information on the position, within each subsampling period, of sampling pulses (sp) which approximately coincide with the transients of the duty cycle modulated square wave (sq) obtained from the corresponding analog input signal (v), and by subsequently multiplexing the plurality of digital output signals into a digital multiplex signal for further processing.

3. A method as claimed in claim 2 characterized by counting sampling pulses (sp) for the conversion of said plurality of analog input signals by means of a common counter (CO).

4. A method as claimed in claim 1 characterized in that the length of the subsampling period is selected so that each subsampling period includes no more than two transients of the duty cycle modulated square wave (sq).

5. A method as claimed in claim 1 characterized by counting sampling pulses during each subsampling period and by detecting and storing the value of the count resulting from said counting upon each occurrence of a transient of the duty cycle modulated square wave.

6. An arrangement for converting an analog input signal into a digital output signal characterized by a duty cycle modulator (1) for deriving a square wave (sq) duty cycle modulated by the analog input signal, a clock synchronous sampling pulse generator (5), a clock synchronous subsampling pulse generator (6) and means for detecting, within each period of the subsampling pulse (ssp), the position of the sampling pulses (sp) which approximately coincide with the transients of the duty cycle modulated square wave (sq).

7. An image sensor comprising a plurality of rows ($R_1$, $R_2$ ... ) of active picture elements, characterized in that the image sensor further comprises a plurality of arrangements (ASD, TD, SS, Ma/Mb) as claimed in claim 6, each of said arrangements being connected to a row (R) of active picture elements for converting the analog video input signal, resulting from scanning the row of active picture elements, into a digital video output signal, and means ($Oa_1$ ... $Oa_n$, $Ob_1$ ... $Ob_n$) for multiplexing the plurality of digital video output signals delivered by said plurality of arrangements.

* * * * *